United States Patent
Zhang et al.

(10) Patent No.: US 6,276,355 B1
(45) Date of Patent: Aug. 21, 2001

(54) CUTTING METHOD AND APPARATUS FOR SECTIONING MULTILAYER ELECTRONIC DEVICES

(75) Inventors: Ji-Guang Zhang, Cerritos; Khoon Cheng Lim, Los Angeses, both of CA (US)

(73) Assignee: Macro Energy-Tech, Inc., Redondo Beach, CA (US)

( * ) Notice: Subject to any disclaimer, the term of this patent is extended or adjusted under 35 U.S.C. 154(b) by 0 days.

(21) Appl. No.: 09/303,960

(22) Filed: May 3, 1999

(51) Int. Cl.$^7$ ............................................. B28D 1/02
(52) U.S. Cl. ............................ 125/20; 125/13.01; 125/15
(58) Field of Search ..................... 83/862–865; 125/12, 125/13.01, 15, 18, 20, 35; 451/57, 65, 177, 178, 194

(56) References Cited

U.S. PATENT DOCUMENTS

| | | | | |
|---|---|---|---|---|
| 3,736,823 | * | 6/1973 | Dingler | 83/165 |
| 3,828,758 | * | 8/1974 | Cary | 125/13.01 |
| 4,829,868 | * | 5/1989 | Jenkner | 83/863 |
| 5,486,133 | * | 1/1996 | Russell | 83/862 |
| 5,915,370 | * | 6/1999 | Casper | 125/23.02 |
| 5,979,525 | * | 11/1999 | Durney | 83/863 |

FOREIGN PATENT DOCUMENTS

| | | | | |
|---|---|---|---|---|
| 56-16597 | * | 9/1981 | (JP) | 83/863 |
| 60-131763 | * | 7/1985 | (JP) . | |

\* cited by examiner

*Primary Examiner*—Derris H. Banks
(74) *Attorney, Agent, or Firm*—James R. Young; Chrisman Bynum & Johnson

(57) ABSTRACT

The slitting assembly includes a grinding wheel with a wide flat grinding face for first cutting a multilayer sheet of soft and compressible, electronic device material, such as lithium-ion polymer material for a uni-cell battery, to a first depth and includes a cutting wheel with a blade-like edge for completing the slit by cutting through uncut layers of the multilayer sheet. The grinding face has a width of at least the thickness of the multilayer sheet, and in practice, the depth of the cut is preferably one half the sheet thickness, which in a uni-cell battery sheet is midway through a separator layer. The grinding wheel is positioned to apply cutting forces to the multilayer sheet in a direction that is substantially parallel to the feed direction to control the application of compressive forces that may compress the soft sheet material and if uncontrolled, may create short circuits between electrically conductive layers. Further, the unique combination of cut width and cut depth function to prevent shorting of the electrically conductive sheet layers during the second cutting by the blade-like edge of the cutting wheel which is completed by resiliently forcing the edge through the final layers of the sheet. In another preferred embodiment, a single, multistage or stepped grinding stone is utilized in the slitting assembly to concurrently grind, and provide lateral support to maintain separation of, multiple layers of a multilayer sheet of electronic device material such as material for a bi-cell lithium ion polymer battery. Alternatively, a single, sloped or angled grinding wheel may be included to provide two grinding faces that establish a grinding angle sufficient to enable concurrent grinding of multiple layers of soft electronic material without compressing or pinching the layers into a shorting contact. Furthermore, a more symmetric cutting or slitting can be made by a slitting assembly having two grinding wheels to concurrently slit a soft, multilayered sheet from opposing sides of the sheet.

48 Claims, 7 Drawing Sheets

CUTTING METHOD AND APPARATUS FOR SECTIONING MULTILAYER ELECTRONIC DEVICES

BACKGROUND OF THE INVENTION

1. Field of the Invention

The present invention relates generally to cutting or machining systems for use in severing a device comprising multiple layers of soft and/or flexible materials into individual pieces and particularly to a method and apparatus for slicing thin sheets of laminated soft materials, including, for example, polymer lithium-ion battery laminates, as part of the fabrication of electronic devices, such as batteries.

2. Description of the Prior Art

Because the use of wireless and cellular telephones, laptop computers, portable radios, and other portable electronic products continues to increase dramatically, the need for lighter, smaller, and cheaper power sources continues to be a key priority in the mobile electronics industry. Specifically, it is desirable that batteries be produced having high energy density, i.e. high power to weight ratio, that are also thin and preferably flexible to facilitate powering thin electronic products, such as portable computers, hand-held calculators, and the like. These batteries generally comprise at least two electrode layers (a cathode and an anode) separated by a separator layer, such as a dielectric material, that is nonconductive to electrons, i.e., an electric insulator. To conduct electricity from the electrode layers of the battery to contacts or battery terminals that can be wired to the electronic product being powered by the battery, a metal grid or foil (e.g., aluminum or copper) may be placed adjacent each electrode layer. Manufacturers make these compact batteries from a variety of materials, including nickel cadmium (NiCD), nickel metal hydride (NiMH), and liquid lithium-ion (Li), in an attempt to meet the demands of the mobile electronics industry for smaller, yet more powerful, batteries. However, the NiMH batteries are relatively heavy and inflexible, and cadmium is a tightly regulated substance due to its high toxicity. While liquid lithium-ion batteries provide two to three times the energy density and are, therefore, lighter and smaller than NiMH batteries, liquid lithium-ion batteries still have limited capacity per weight due to heavy packaging design requirements. Because liquid lithium-ion batteries use non-bonded cell technology similar to most other batteries, these batteries require high-modulus, mechanically strong packaging to accommodate pressures applied on the cells or batteries to maintain intimate contact among cell components. The pressures applied on the cells limit the design of such batteries to small cylinder or prismatic shapes to control packaging deformation. However, the cylinder and prismatic shaped cells generally cannot be arranged into multi-cell battery packs without a loss of 20 to 30 percent of total battery volume because of packing inefficiencies. Therefore, it is highly desirable to replace non-bonded cells with bonded, flat plate lithium ion cells to increase the power capacity to weight ratio, enhance cell packing efficiency, and improve cell and battery pack design flexibility.

Since about 1990, the electronics industry has been developing bonded, solid state, flat plate lithium-ion batteries and other polymer batteries. In this battery technology, the polymers used in the three main components (i.e., the cathode, the separator, and the anode) of each battery have similar material properties that enable the entire battery to be bonded together to form a single, laminated unit or sheet. For example, the active material in the anode layer(s) may be carbon or other materials, the active material in the cathode layer(s) may be lithium cobalt oxide ($LiCoO_2$), lithium manganese oxide ($LiMn_2O_4$), lithium nickel oxide ($LiNiO_2$), and the like. Because the polymer matrix used in the battery is passive to the operation of the battery, any electrically active materials or electrolytes can be utilized in the battery. Polymer lithium-ion batteries may exhibit 20 to 30 percent higher specific energy densities over liquid lithium-ion batteries. Furthermore, polymer lithium-ion batteries may be formed into small, lightweight, flat (i.e., 0.1 to 1 mm thicknesses) shapes that are also flexible and moldable to facilitate installation in myriad electronic product packaging cases or applications. The development of polymer lithium-ion batteries is a significant step toward meeting power, weight, and size goals of the mobile and micro electronics industry, because these batteries may be installed in very thin, compact electronic products having strict overall package sizing requirements. Polymer lithium-ion batteries are also more environmentally benign and are safer to use than many other marketed batteries.

Unfortunately, a continuing impediment to commercial implementation of lithium-ion polymer batteries is the difficulty in manufacturing the batteries effectively and inexpensively on a large, mass production scale. Present manufacturing technologies, such as thin film casting, extrusion, and the like, are readily available to prepare large area, thin (i.e., 0.1 to 1 mm) component layers used in polymer lithium-ion batteries, such as cathode layers, separator layers, anode layers, and conductive foils and grids, which can be bonded easily into a single, large area, laminated unit or sheet under controlled temperatures and pressures. However, cutting or slicing the bonded unit or laminated sheet of relatively soft polymer battery material into smaller pieces for practical applications continues to present major challenges to battery manufacturers. Current cutting methods generally utilize cutting wheels with sharp, knifelike edges to cut through the large area, multilayer sheets to slice them into smaller, more useable sizes. A downward, compressive force is applied to the cutting wheel to push the sharp edge of the cutting wheel transversely through all the layers of the large area, laminated sheet while the cutting wheel rotates passively as it is moved laterally in relation to the sheet. Such rotation of the cutting wheel reduces lateral frictional forces developed in the laminated sheet that would tend to distort material layers in a lateral direction during cutting. However, due to the softness and flexibility of the polymer, metal foil, and other layers of the sheet, the sharp edge of the cutting wheel still compresses, distorts, and pinches the layers of material together at the cut surfaces as the edge of the cutting wheel is pushed transversely through the layers of the sheet. Such pinching and deformation can and often does result in the anode and cathode layers and/or the top and bottom metal grids or conductor layers coming into contact or at least into very close proximity to one another, which short circuits the anodes and cathodes of the separated sheets and renders them useless as batteries.

Because the industry has not overcome these short circuit problems caused by such state-of-the-art slicing apparatus and processes, manufacturers have been forced to resort to more labor and equipment-intensive manufacturing methods to produce lithium-ion polymer batteries, producing each battery individually, instead of in mass, by fabricating each layer of the battery to its final dimensions and then aligning and assembling or laminating each layer together to form the desired multilayer battery device. This kind of process and other inefficient alternate manufacturing methods have hindered large-scale production of polymer lithium-ion batteries.

Consequently, there remains an acute need for manufacturing methods and apparatus that enable cutting or slicing of large area sheets of soft, flexible, multiple layer materials into desired shapes and sizes without distortion at the layers at the cut edges to facilitate large-scale commercial implementation of the smaller, more flexible, and higher energy density electronic devices, such as batteries. Specifically, an improved slicing method and apparatus is needed to eliminate the problems of short circuiting layers of electrically-conductive polymer and/or metal foil materials used in lithium-ion polymer batteries in an effective and reliable, yet inexpensive manner.

SUMMARY OF THE INVENTION

Accordingly, it is a general object of the present invention to provide an improved method of cutting large area thin sheets of flexible and relatively soft, multilayer electronic device material into smaller area units that can be used as individual electronic devices.

A more specific object of the present invention is to provide slicing apparatus operable to slice multilayer sheets of lithium-ion polymer battery laminate material to produce individual batteries of desired sizes and shapes without short circuits between electrically conductive layers at the cut edges.

A related specific object of the present invention is to provide a method of slicing thin sheets comprising laminated layers of electrically conductive polymer, metallic conductor grid, and polymer insulator layers that avoids short circuits between layers in an effective, repeatable, and a cost-effective manner.

Another general object of the present invention is to provide a slicing apparatus and method for slicing thin sheets of soft and compressible materials that does not cause undesirable contact between layers of the sheet containing non-compatible materials.

Additional objects, advantages, and novel features of the invention are set forth in part in the description that follows and will become apparent to those skilled in the art upon examination of the following description and figures or may be learned by practicing the invention. Further, the objects and the advantages of the invention may be realized and attained by means of the instrumentalities and in combinations particularly pointed out in the appended claims.

To achieve the foregoing and other objects and in accordance with the purposes of the present invention, as embodied and broadly described herein, a slicing assembly may comprise a grinding wheel with a flat, wide grinding face of abrasive particles for first cutting a workpiece, e.g., a sheet of relatively soft and compressible multilayer electronic device material such as polymer lithium-ion uni-cell, partially through the thickness or depth of the workpiece or through one or more, but not all the layers of the workpiece, and a cutting wheel with a blade-like edge that follows the grinding wheel for next cutting through the remaining thickness or depth of the workpiece to separate lower, uncut layers to complete a slit, cut, or slice. Within the slicing assembly, the workpiece can be supported on a table that moves or feeds the workpiece to the grinding and cutting wheels. The grinding wheel is rotatable on a spindle at speeds high enough to facilitate grinding materials of the workpiece, and the grinding wheel is positioned to contact the workpiece as it is fed past the grinding wheel. To control compression of the soft material layers and reduce shorting concerns, the grinding face removes material by applying abrasive cutting forces to the workpiece preferably in a direction substantially parallel to the feed direction of the table. To further minimize shorting of layers in cutting multilayer electronic devices, the grinding face profile is preferably transversely linear with a transverse width that is preferably equal to or greater than the thickness of the workpiece, and the grinding face is used to make a first cut preferably having a depth of approximately one half the thickness of the workpiece, e.g., in uni-cell battery material, the first cut is midway through the middle, separator, or electrolyte layer. With the relatively wide first cut partially through the thickness or depth of the workpiece completed, the workpiece is next fed to the cutting wheel, which contacts the workpiece through the wide first cut, and its blade-like edge is urged through each additional layer that was not cut by the grinding wheel. The width and depth of the first cut by the grinding wheel effectively reduces or eliminates any possibility that upper electrically conductive layers in a multilayer electronic device will be compressed, pinched, or deformed into contact with the lower electrically conductive layers of the workpiece during completion of the second stage of the cutting with the cutting wheel.

To further achieve the foregoing and other objects, another preferred embodiment of a slicing assembly may include a single grinding wheel operable to slice a multilayer sheet of electronic device material. The grinding wheel is a multi-stage, i.e., symmetrically-stepped, grinding wheel with an abrasive portion having multiple stage grinding faces of abrasive particles for cutting different depths and widths into the workpiece simultaneously. The upper and wider stages of the grinding wheel maintain separation of upper electrically conductive layers from lower electrically conductive layers that are cut by lower and narrower stages of the grinding wheel. As with the sequential two-wheel embodiment of the slicing assembly described above, the grinding faces of this multi-stage grinding wheel rotate preferably at high velocities and are positioned within the slicing assembly to apply a cutting or grinding force preferably in a direction substantially parallel to the workpiece feed direction, thereby minimizing the application of compressive forces that might deform separate electrically conductive layers into contact with each other. As the multi-stage grinding wheel advances through the workpiece, the workpiece is first cut by a large diameter, central, initial stage with a substantially rectangular transverse cross-section defined by a face width and depth. The workpiece is next cut by a smaller diameter, second stage comprising a grinding face that protrudes laterally, preferably, but not necessarily, symmetrically and perpendicularly, from the lateral sides of the larger diameter initial stage and has lateral sides extending radially from the grinding face to define a transverse rectangular cross-section. In this manner, the second stage cut functions to widen the first stage cut or slit in the upper layers of the workpiece to minimize or eliminate the possibility of electrical short circuiting between electrically conductive layers in the upper portion of the workpiece and electrical conductors in the lower portion of the workpiece. Additional stages can also be formed in a similar manner on the grinding wheel, and the number of additional stages may be increased or decreased readily to better match the number and thicknesses of layers of a given workpiece. In practice, a multistage grinding wheel having three stages is especially effective in slicing an eleven-layered workpiece, such as a sheet of material for bi-cell polymer batteries which may have eleven repeating layers of alternating conductor, cathode, separator, anode, conductor materials. The preferred width and depth of each stage of a multistage grinding wheel depends upon the total thickness of the workpiece and the thicknesses and arrangements of the layers. Preferably, the width of each stage after the initial stage is about equal to twice the portion of the total workpiece that remains after that stage makes its cut.

To still further achieve the foregoing and other objects, another preferred embodiment of a slitting assembly is provided that includes a single, sloped or angled grinding wheel to slice a multilayer sheet of compressible electronic device material, such as material for a lithium-ion polymer bi-cell battery. The sloped grinding wheel includes an abrasive portion with a triangular transverse cross-sectional area having two grinding faces of abrasive particles that each form a contact or grinding angle with the layers of the workpiece. The grinding faces are rotated at high speed and apply a substantially parallel cutting force on the workpiece to cut a V-shaped slit in the workpiece. In a further embodiment, two grinding wheels, sloped or rectangular-faced, are provided and fed concurrently from opposite sides of a workpiece.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention. In the Drawings.

DETAILED DESCRIPTION OF THE PREFERRED EMBODIMENTS

A slicing assembly 10 for use in separating or sectioning a thin (e.g., less than 1 millimeter) sheet comprising a number of layers of relatively soft and deformable materials for use in electronic devices, such as batteries, is illustrated in FIGS. 1–4 and 6–7. While the present invention is useful for slicing or sectioning a variety of thin, multilayered devices or layered sheets, the following description utilizes the example of slicing a sheet containing five layers of material for use in a uni-cell battery and another example of slicing a sheet containing eleven layers of material for use in a bi-cell battery. More specifically, the present invention is described in the context of slicing or sectioning sheets of uni-cell and bi-cell battery material fabricated with polymer lithium-ion battery technology, a solution to ineffective prior art slitting and sectioning techniques used in the electronics industry. These examples are used as a convenience to explain and understand the invention, but are not intended to limit the invention, since they are representative of the principles and benefits of the invention that can apply to myriad sheet structure and slicing applications in which deformation of one or more layers in such sheet structures would be detrimental.

Figure 5:
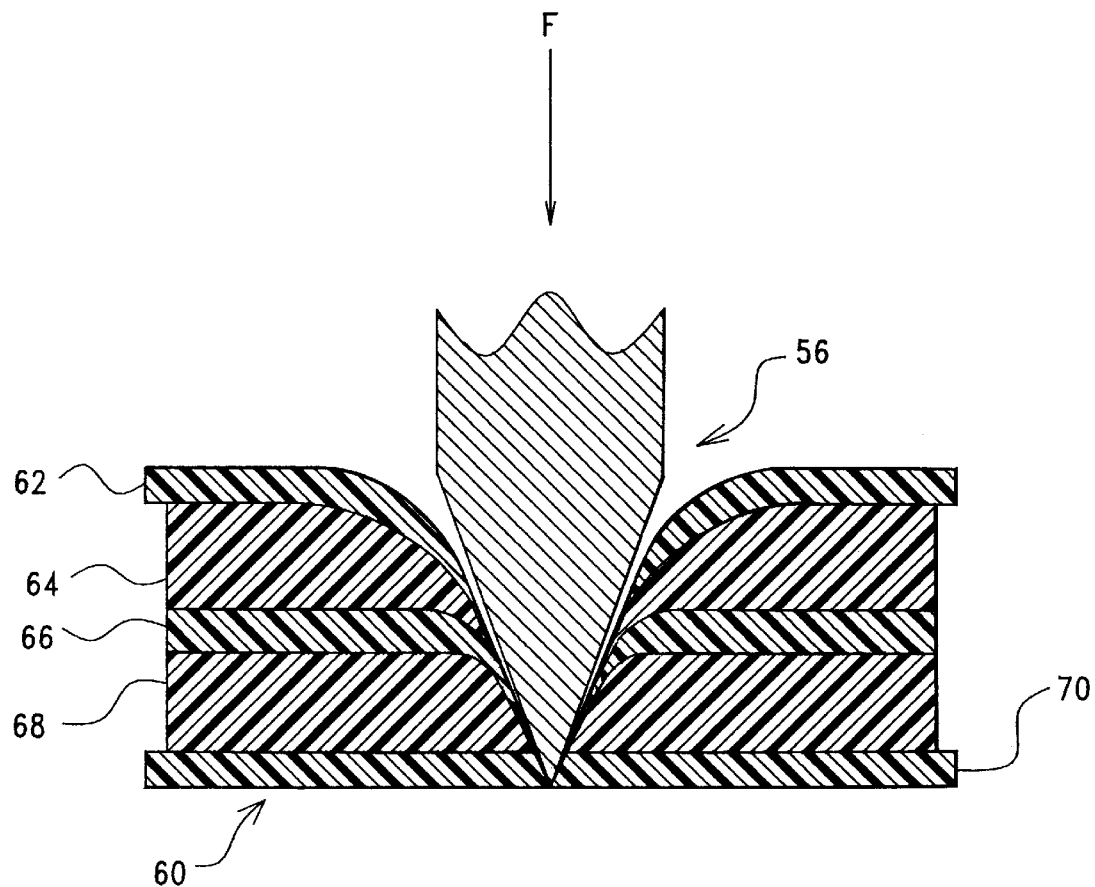
FIG. 5 is a partial cross-sectional view of a prior art single rotary wheel cutting device illustrating the layer distortion problem caused by compression of soft material layers of a multilayer workpiece, which, if some of such layers are electrical conductors in electronic devices, can result in undesirable electric shunts or short circuits between layers.

As an aid to understanding such layer deformation problems that can be avoided by use of this invention, FIG. 5 illustrates how a five-layered sheet 60 of material for a polymer lithium-ion uni-cell battery is cut into segments using a prior art cutting method and device 56, that may be a single cutting wheel with a sharp circumferential edge. The sheet 60 is illustrated with top and bottom electrical conductor layers 62 and 70, respectively, that may comprise metallic grids or foils of aluminum, copper, or the like for providing electric contact points or terminals and for conducting electricity to and from the uni-cell battery. The sheet 60 further includes polymer-bounded materials in a cathode layer 64, a separator layer 66, and an anode layer 68. These polymer-bounded layers are generally relatively soft with a rubber-like consistency. In a polymer lithium-ion uni-cell, the anode layer 68 may comprise a polymer-bounded carbonaceous material, the cathode layer 64 may include a polymer-bounded composite of lithium (Li), oxygen, and a transition metal such as cobalt (Co) or manganese (Mn), and the separator layer 66 may be a solid polymer electrolyte. Use of the same polymers to bound cathode 64, separator 66, and anode 68 provides a lightweight, higher energy density cell. However, as illustrated in FIG. 5, when the prior art, knife-edged cutter device 56 is forced downwardly by a force F through the layers 62, 64, 66, 68, and 70, each layer is compressed or pinched and deformed toward adjacent layers. Specifically, top conductor layer 62 and/or the cathode layer 64 is/are deformed into electrical contact with the anode layer 68 and/or the bottom conductor layer 70 or in close enough proximity of to each other to cause electric shunts or short circuit paths between these electrically conductive layers, which degrades or destroys the potential use of resulting slices of the material as electronic battery devices.

Figure 6:
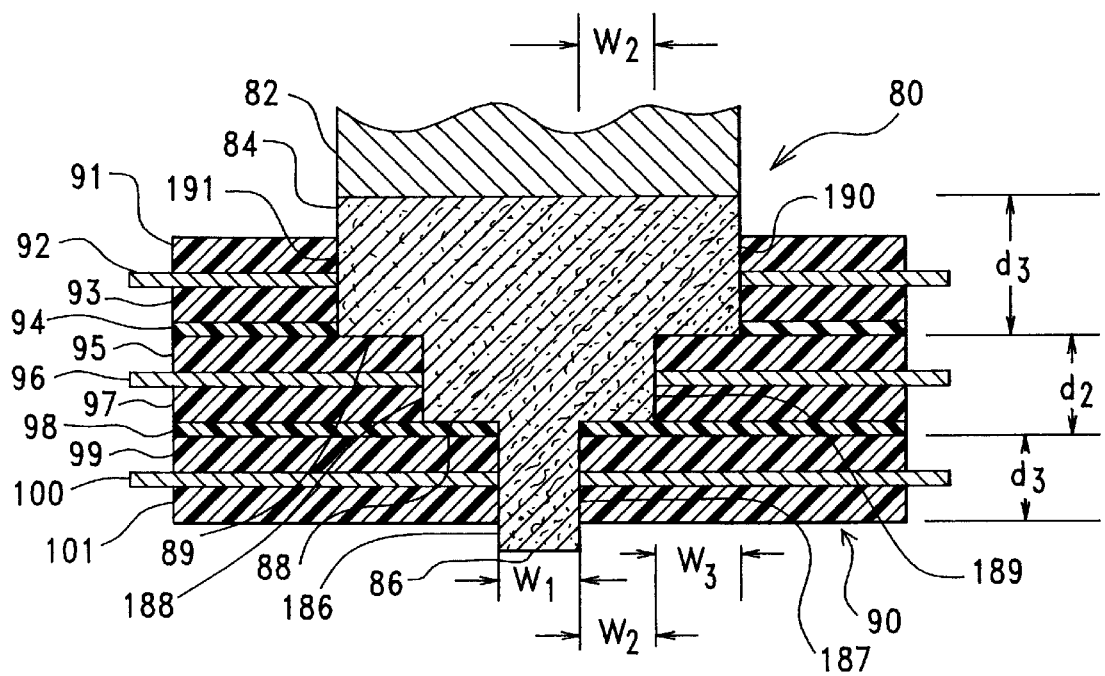
FIG. 6 is a partial cross-sectional view, similar to FIGS. 3 and 4, of another preferred embodiment of the present invention utilizing a multistage grinding stone to complete a cut on a multi-layered workpiece.
Figure 7:
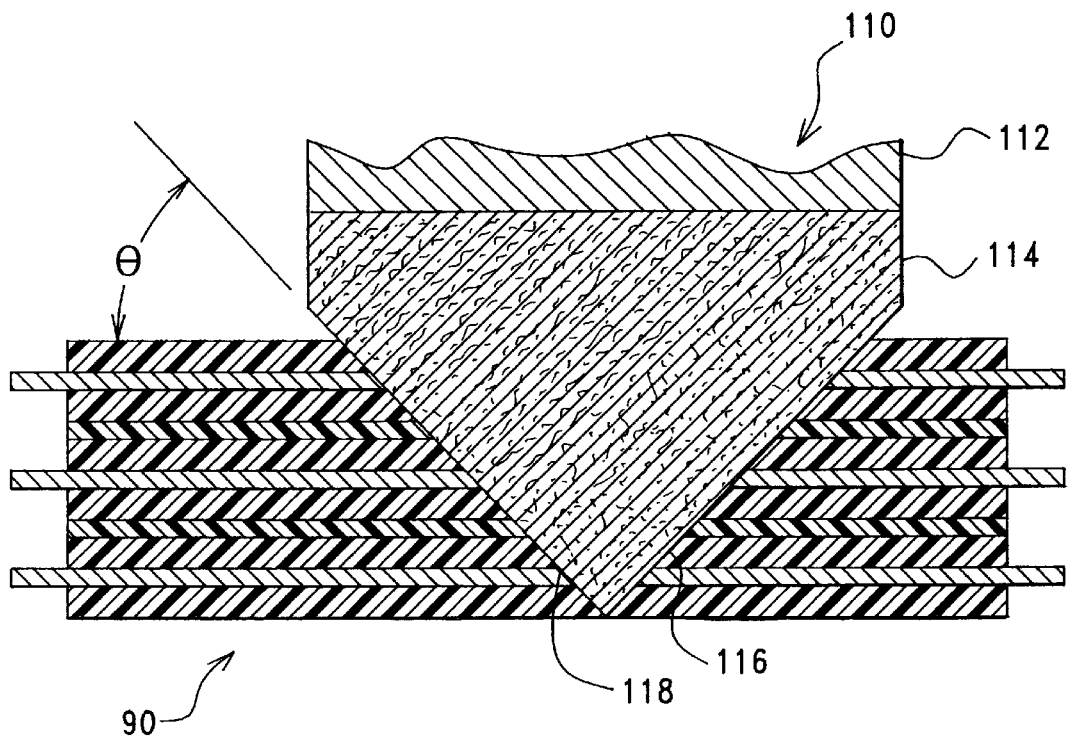
FIG. 7 is a partial cross-sectional view, similar to FIG. 6, of yet another preferred embodiment of the present invention utilizing a double-taper grinding stone to complete a cut on a multiple-layered workpiece.

Such short circuit problems across separator or insulative layers caused by such prior art cutting apparatus and methods as that illustrated in FIG. 5 would be even more pronounced and difficult to overcome during sectioning of multilayered sheets of material for use in lithium-ion polymer bi-cell batteries such as those illustrated in FIGS. 6 and 7, where a multi-layered sheet 90 may contain as many as eleven or more layers of soft, deformable materials. Although not illustrated, a prior art cutter 56 as shown in FIG. 5 would be practically useless for slicing such multilayer sheets 90 of FIGS. 6 and 7 because it would be impractical, if not impossible, to separate the deformed, short circuited layers from each other at the edges of the cuts.

As will become apparent from the following description, the slicing apparatus 10 of the present invention shown in FIGS. 1–4 provides a number of features that avoid the short circuit problems encountered in the prior art methods of cutting sheets of flexible, multilayered polymer materials. For example, the slicing apparatus 10 of the present invention utilizes at least one abrasive grinding surface 28 for grinding through at least the upper layers 62, 64 of a multilayer sheet 60. This grinding surface 28 contacts the layers 62, 64 of the sheet 60 at a high velocity and applies a grinding force in a direction substantially parallel to the layer 62, 64 of the sheet 60 to reduce significantly the application of downwardly directed compressive forces on the sheet 60. It is also important for the grinding surface 28 to be wide enough to remove enough material from upper or initially contacted layers 62, 64 so that as lower or later contacted layers 68, 70 are cut by a narrower cutting wheel 30, it is unlikely that these upper layers 62, 64 will be deformed into proximity or contact with the lower layers 68,70. Lateral support of the upper layers 62, 64 while cutting lower layers 68, 70 to resist downward deformation of these upper layers 62, 64 can also reduce likelihood of causing short circuit problems during slicing of the sheet 60. These and other significant features of the present invention will be discussed in more detail below.

Figure 1:
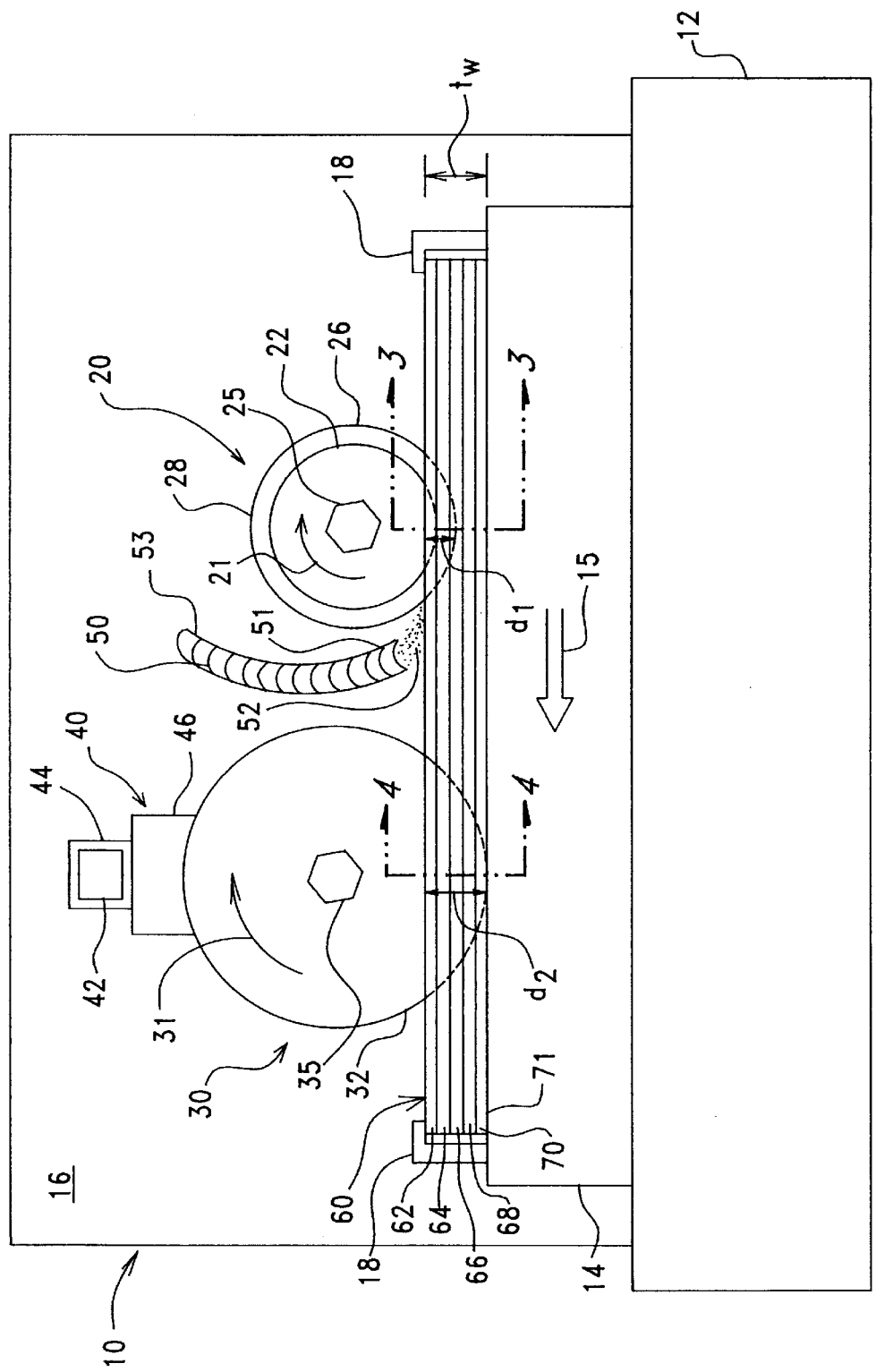
FIG. 1 is a front elevation view of a tandem slicing apparatus of the present invention being operated to slice or section a workpiece.
Figure 2:
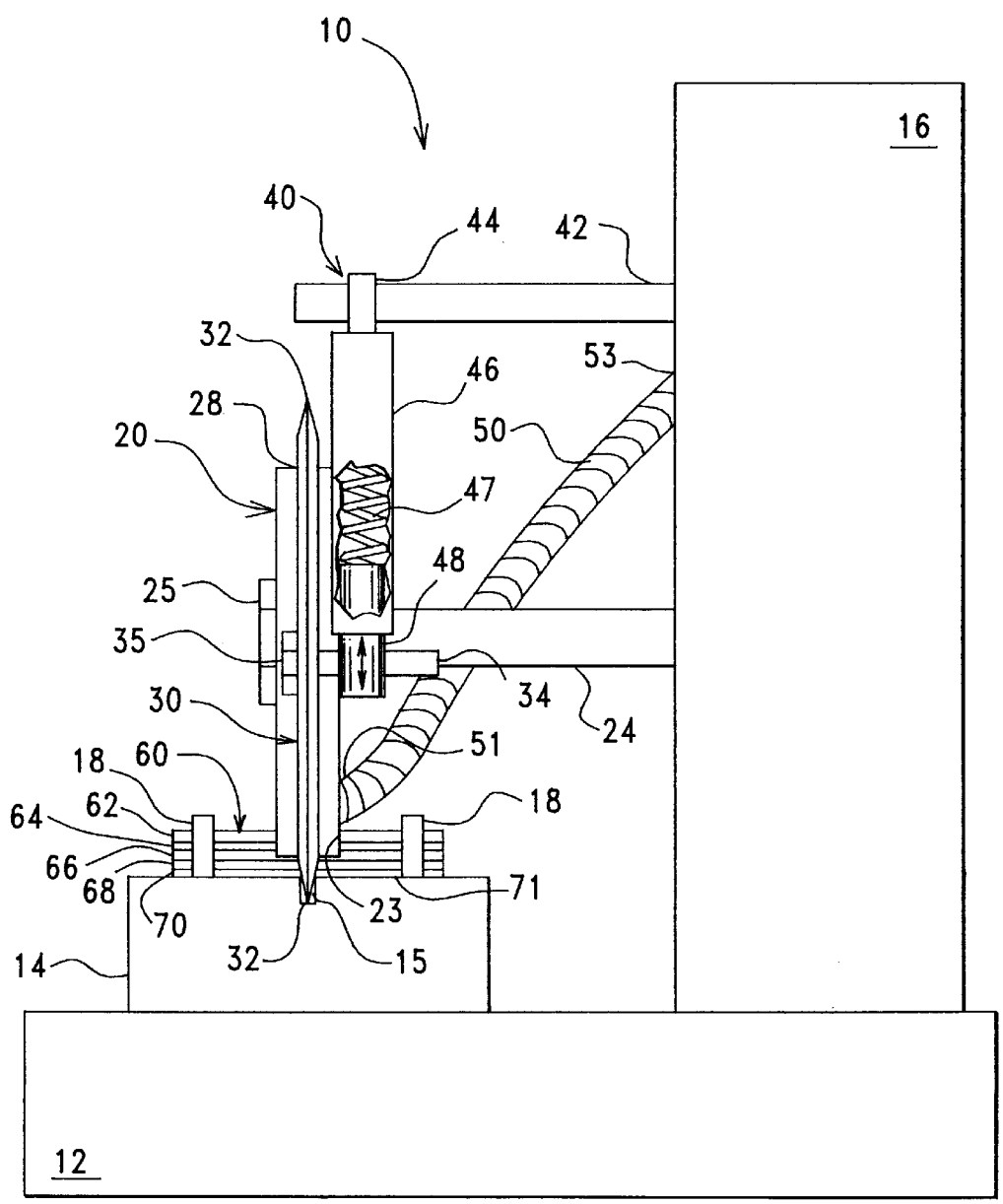
FIG. 2 is a left side elevation view of the tandem slicing apparatus shown in FIG. 1.
Figure 3:
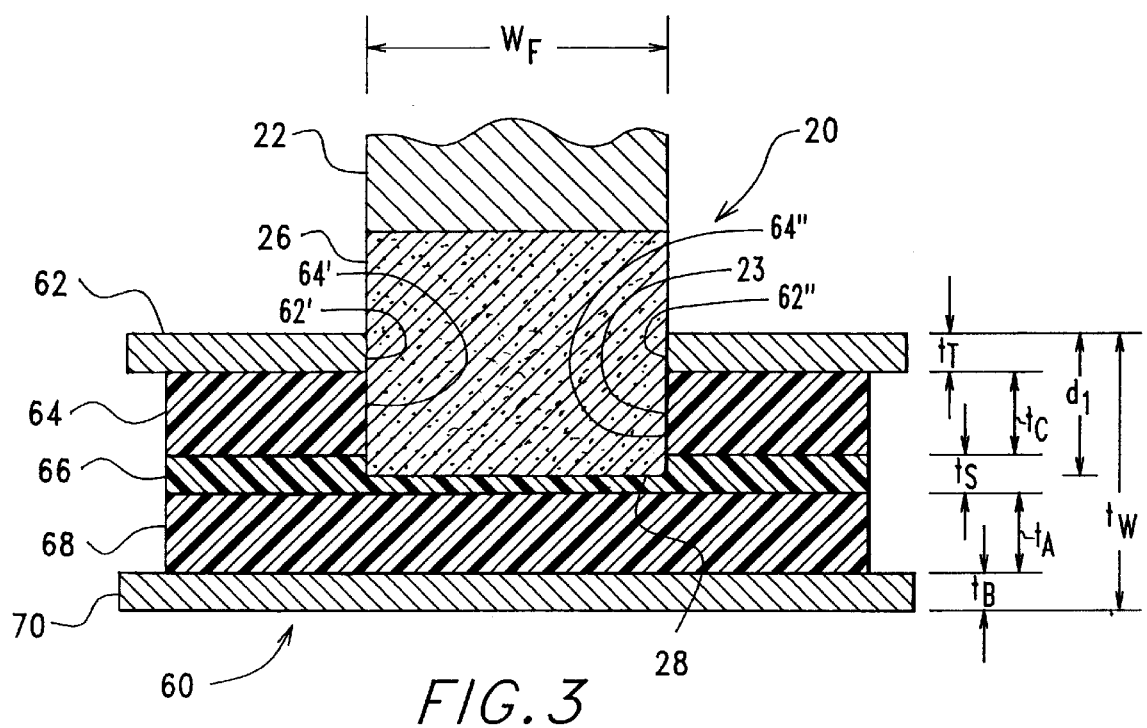
FIG. 3 is a partial cross-sectional view of a first stage grinding wheel of the tandem slicing apparatus taken along section line 3—3 in FIG. 1 shown cutting a multilayer workpiece.
Figure 4:
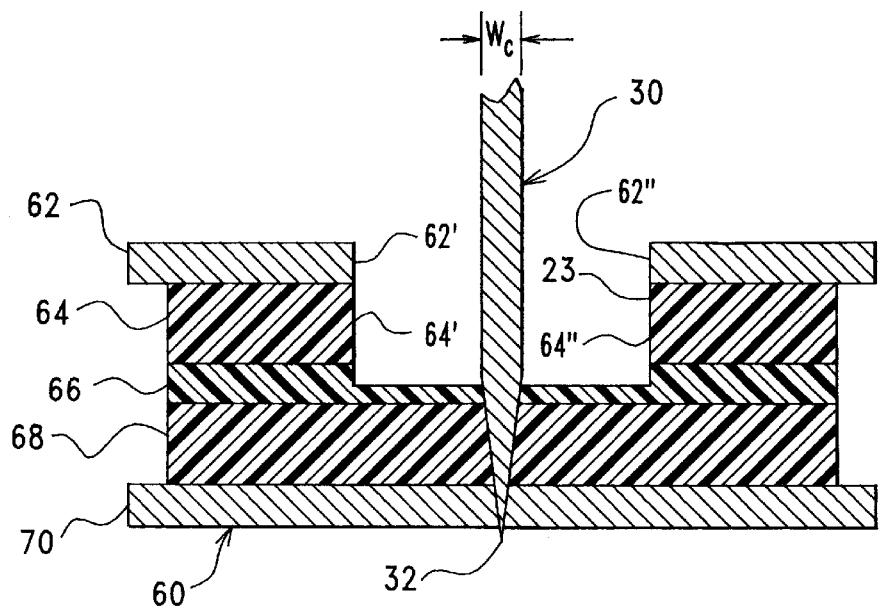
FIG. 4 is a partial cross-sectional view of a second stage cutting wheel of the tandem slicing apparatus taken along section line 4—4 in FIG. 1 shown cutting a multilayer workpiece.

Referring now to FIGS. 1 and 2, slicing apparatus 10 according to this invention is illustrated performing slicing or sectioning of a multilayered sheet or workpiece 60. The slicing apparatus 10 generally includes a rotating grinding wheel 20 and a rotatable cutting wheel 30 positioned in tandem relation to each other and set to slice at different depths $d_1$, $d_2$, respectively, into the thickness $t_w$ of multilayered workpiece 60. The multilayered workpiece 60 is mounted by clamps 18 on a translatable table 14, which, when moved in the direction indicated by arrow 15, causes the grinding wheel 20 to cut a wide groove 23 (not shown in FIG. 1, but shown in FIGS. 2 and 3) through the upper layers 62, 64 followed by the narrower cutting wheel 30, which cuts from the groove 23 the rest of the way through the lower layers 68, 70. The table 14 can be mounted on any suitable translation apparatus (not shown), which can be supported by a suitable frame or bed 12. Such translation apparatus are well-known and not considered to be a part of this invention. The table 14 may have a longitudinal trough 15, best seen in FIG. 2, into which the peripheral cutting edge 32 of the cutting wheel 30 can protrude to ensure it cuts all the way through the bottom surface 71 of the lowest layer 70 of the workpiece 60. The wider grinding wheel 20 is set to cut to a depth $d_1$ that extends at least through upper layers 62, 64, and preferably through a part of separation layer 66, while the narrow cutting wheel 30 is set to a depth $d_2$ that extends the rest of the way through the thickness $t_w$ of the workpiece 60, i.e., the rest of the way through the separator layer 66 and all the way through the lower layers 68, 70. Of course, the depths $d_1$ and $d_2$, the thicknesses of individual layers 62, 64, 66, 68, 70, and the overall thickness $t_w$ of the workpiece 60 are not drawn to scale or in actual proportion to each other, but are instead exaggerated for clarity. However, as best seen in FIGS. 2–4, the grinding wheel 20 is wider than the cutter wheel 30 so that the cutter wheel 30 does not contact either the cut edges 62', 62" of upper contact layer 62 or the cut edges 64', 64" of the cathode layer 64. Therefore, neither the upper contact layer 62 nor the cathode layer 64 get deformed by the cutter wheel 30 into contact with either the anode layer 68 or the lower contact layer 70, and no short circuit problem is created in the process of slicing the workpiece 60 with this slicing apparatus 10 according to this invention.

The grinding wheel 20 is mounted on a rotatable shaft 24 and can be rotated as indicated by arrow 21 with a suitable driving motor (not shown), such as a common electric motor, which can be positioned in a housing 16. The cutter wheel 30 is not motor-driven, but is mounted to a rotate passively on a spindle 34 so that it rotates as indicated by arrow 31 in response to frictional forces of the moving workpiece 60 acting on the periphery of the cutting wheel 30. While it is not necessary to the invention, the spindle 34 and cutting wheel 30 can be biased downwardly onto the workpiece 60 by a compression spring 47 mounted in a container 46 and acting on a rod 48, which supports the spindle 34. The spring container 46 can be attached by a rod 44 to a bracket 42 extending outwardly from the housing 16. If such a compression spring 47 is used, it has to be strong enough to exert sufficient force on rod 48 and spindle 34 to force the cutting wheel 30 to cut through the middle and lower layers 66, 68, 70 of the workpiece 60.

A vacuum duct 50 can be provided with an open end 51 adjacent the grinding wheel 20 to suck away debris 52 created by the grinding process during slicing operations. The other end 53 of the vacuum tube 50 can be connected to a suitable vacuum source, such as a vacuum pump and filter assembly (not shown), which can also be in the housing 16.

The clamps 18 could be replaced by any state-of-the-art retaining equipment, such as vacuum hold-down ports in the table 14, adhesives, weights, fasteners, or the like, none of which are shown here, but all of which are well-known in the industry.

The vertical positioning of the grinding wheel 20 and/or the cutting wheel 30 can be selectable or variable to allow a user of the slicing apparatus 10 to set different depths of cuts for the grinding wheel 20 and the cutting wheel 30 for different workpiece 60 thicknesses, as will be described in more detail below, as well as to accommodate use of grinding wheels 20 and cutting wheels 30 of different diameters, such as, for example, grinding wheels 20 with diameters of about 76 to 178 millimeters (3 to 7 inches) or larger. Alternatively, or in combination, vertical positioning of the workpiece 60 within the slicing apparatus 10 may be accomplished by providing the table 14 with movement in the Z-axis. Such vertically adjustable mountings for the grinding and cutting wheels 20, 30 or of the translation table 14 are well within the knowledge of persons skilled in the art, thus are not part of this invention and are not shown in FIGS. 1 and 2.

To control application of grinding forces by the grinding wheel 20, it is preferable that the grinding wheel 20 rotates in a direction such that grinding forces are applied to the workpiece 60 substantially along the feed direction 15 of the table 14. For example, as illustrated in FIG. 1, the grinding wheel 20 is shown to rotate in a clockwise direction 21 so that grinding forces applied to the workpiece 60 by the bottom of the grinding wheel 20 are in substantially the same direction as the illustrated feed direction 15. It is also preferred, but not essential, that the rotation speed of the grinding wheel 20 be variable, such as between 0 to 5,000 rpm, to accommodate different sizes and abrasive types of grinding wheels 20 as well as different kinds of workpiece materials 60. Persons skilled in the art can provide DC drive motors and controllers for such speed control. The open end 51 of the vacuum or suction duct 50 should be positioned behind the grinding wheel 20 to collect grinding debris 52. Suctioning the grinding debris 52 enhances the cutting quality of the cutting wheel 30 by reducing binding that could be caused by the debris 52.

The table translation apparatus (not shown) can also be variable in speed to move the workpiece 60 in the feed direction 15 at a selected desirable feed rate, such as 0 to 50 centimeters per second, depending on the workpiece 60 materials and on the size and abrasiveness of the grinding wheel 20 being used. Harder workpiece 60 materials and smaller, finer grinding wheels would generally, but not necessarily, require slower feed rates than softer workpiece materials and larger, courser grinding wheels 20. The translation apparatus (not shown) could also be able to move the table in both X-axis and Y-axis perpendicular directions or may also be rotatable through 360°, which is well-known to persons skilled in the art, to facilitate precision sectioning of the workpiece 60 into various shapes and sizes. Of course, the workpiece 60 could be held stationary while the grinding wheel 20 and cutter wheel 30 are moved in relation to the workpiece 60, which is also within the capabilities of persons skilled in the art.

The above discussed functions of the slicing apparatus 10, including selectable rotation speeds, table location, and table feed, may be automated or semi-automated. Additionally, while not shown, the slicing apparatus 10 may include a transparent plastic or glass enclosing box extending from the housing 16 and enclosing the work area near the grinding wheel 20 and cutting wheel 30 to control the cleanliness and safety of the slicing operations.

A significant feature of the present invention is the inclusion of the grinding wheel 20 in the slicing apparatus 10 for removing material from upper layers of the workpiece 60 through relatively gradual grinding processes or minimal compressive force application. As discussed above, the grinding wheel 20 is positioned vertically within the slicing apparatus 10 and relative to the workpiece 60, which is fed into contact with the grinding wheel 20 by the translation table 14 to achieve a linear slit at a selectable depth. The grinding wheel 20 comprises an inner hub portion 22 that may be a metallic or other suitable material or a part of the abrasive material, an abrasive portion 26 bonded to the hub portion 22 (if the hub portion 22 is not the same abrasive material as the abrasive portion 26), and a spindle fastener 25 for attaching the grinding wheel 20 to the wheel spindle 24. The abrasive portion 26 is made up of abrasive particles, such as diamond, aluminum oxide, silicon carbide, and/or cubic boron nitride particles, selected to have a hardness greater than the workpiece 60 materials and inorganically or organically bonded together to form a grinding profile with a grinding face 28. Because the materials of the workpiece 60 are relatively soft, the grinding wheel 20 may have a high hardness rating to insure tight binding of the abrasive particles within the abrasive portion 26. While more rounded or arcuate grinding profiles may be useful with the present invention, a preferred profile for the abrasive portion 26 is the rectangular profile illustrated in FIG. 3. A fine-grain abrasive, such as fine diamond particles, may be preferable for this profile to provide more durable, sharp corners or edges and to facilitate the trueing of the dimensions of a relatively thin abrasive portion 26. In this regard, the width, $w_F$, of the grinding face 28 is the same as that of the abrasive portion 26, and for most workpieces 60 will range from 0.1 to 3 millimeters or more.

Significantly, the width, $w_F$, of the grinding face 28 is chosen to be at least about the thickness, $t_W$, of the workpiece 60. For example, a workpiece 60 comprising layers 62, 64, 66, 68, 70 for fabricating polymer lithium-ion uni-cells may have a thickness, $t_W$, of only about 0.4 millimeters, and in this example, the width, $w_F$, of the grinding face 28 would be at least 0.4 millimeters. The use of a one-to-one or larger ratio between grinding face 28 width, $w_F$, and workpiece 60 thickness, $t_W$, is desirable for controlling the downward pinching and resulting deformation of upper layers 62, 64 during later cutting by the cutting wheel 30. With the relatively wide first cutting or grinding by the grinding wheel 20 of the upper layers 62, 64, as illustrated in FIG. 3, later compressive cutting with cutting wheel 30 will most likely not result in short circuiting even if these upper layers 62, 64 are pulled slightly downward, because upper layers 62, 64 will not be pulled downward a distance as large as the width, $w_F$, of the first cut. To further control short circuiting, the first cut or grove 23 made by the grinding wheel 20 is preferably deep enough to cut through the top conductor layer 62 and the cathode layer 64 or to a depth equal to the combined thickness of these layers ($t_T+t_C$), and more preferably, to a depth of about one-half the thickness, $t_W$, of the workpiece 60 ($t_T+t_C+0.5t_S$). As discussed above, the relative vertical positioning of the grinding wheel 20 to the workpiece 60 may be accomplished by selectable positioning of the wheel spindle 24 within the housing 16 and/or by Z-axis positioning of the table 14. In this manner, the desired depth, $d_1$, of cut 23 equal to about one-half the workpiece thickness, $t_W$, can be achieved and, when combined with the advantageously selected width of the grinding face, $w_F$, can result in a relatively wide and deep first cut 23 having a substantially rectangular profile. The dimensions and shape of the first cut helps to control short circuiting or pinching of layers 62 and 64 into layers 70 and 68, respectively, by reducing the thickness of material that must be cut 23 by the cutting wheel 30 and by increasing the distance the upper layers 62, 64 would have to be deformed and distorted to create an electrical short circuit path with lower layers 68, 70.

To further reduce the risk of short circuiting during slicing operations, the slicing apparatus is operable to control grinding forces applied by the grinding face 28 on the layers 62, 64, 66 of the workpiece 60. Specifically, a substantial vector component of the grinding forces are applied by the grinding face 28 in a direction parallel to the layers 62, 64, 66 and a much smaller vector component of the grinding forces are perpendicular to the layers 62, 64, 66, thus compressive in the perpendicular direction. A more parallel grinding force vector component is achieved by using a grinding wheel 30 with a diameter that is much larger than the thickness, $t_w$, of the workpiece 60 or the cutting depth, $d_1$, desired. The depth, $d_1$, of the cut is achieved, and also limited, by the grinding wheel 20, as discussed above, by moving the workpiece 60 into contact with the grinding face 28 in a direction 15 substantially parallel to a contact plane of the grinding face 28. The table 14 moves the workpiece 60 at a feed rate into the grinding wheel 20 spinning at a high angular velocity at which point a relatively flat, rectangular cutting portion of the grinding face 28 contacts the top conductor layer 62, and then grinds successively into layers 64 and 66, at a contact velocity high enough to readily remove material with included abrasive particles. The contact velocity may be about 50,000 centimeters per minute or, more preferably, a contact velocity of about 70,000 centimeters per minute or greater may be used. The contact area is maintained generally planar or flat by selecting a grinding wheel 20 with a diameter that is very large in comparison to the depth, $d_1$, of material being removed and even to the overall thickness, $t_W$, of the workpiece 60. For example, the grinding wheel 20 diameter may be 178 millimeters or more while the thickness, $t_W$, of the workpiece 60 may be 1 millimeter or less; therefore, only a very small portion or arc of the grinding face 28 will contact the workpiece 60 at any given time. A preferred, but not necessary, ratio of grinding wheel diameter to depth, $d_1$, of cut may be in a range of about 50:1 to 200: 1. Further, a large portion of the grinding force is applied to the forward or initial portion of this arc, such that abrasive force vector components are substantially parallel to the feed direction, as explained above. In this manner, the grinding force vector components applied to the workpiece are predominantly parallel, and preferably along the feed direction of the table 14, thereby minimizing downward compression and pinching or deformation of upper layers 62, 64 toward lower layers 68, 70.

Further, the rectangular cross-sectional area or profile of the abrasive portion 26 shown in FIG. 3 may provide some lateral support of previously cut layers. As the grinding face 28 proceeds to lower layers, the sides of the abrasive portion 28 comprising abrasive particles grind and shape the edges 62', 62" and 64', 64" of the previously cut layers 62, 64, respectively, if they are pulled into contact with the grinding wheel 20. In contrast, as illustrated in FIG. 5, when the sides of the prior art device 56 contact the first cut layers 62, 64, they frictionally pull and deform these layers 62, 64 into contact with lower layers 70, 68, respectively. By controlling the application of grinding forces by the grinding wheel 20, the slicing apparatus 10 of the present invention is operable to slice upper layers, such as layers 62 and 64, with minimal compression and little or no deformation.

Another significant feature of the present invention is the inclusion in the slicing apparatus of both the grinding wheel 20 for removing material from upper layers 62, 64 of the workpiece 60 and the cutting wheel 30 for cutting through the lower or uncut layers 68, 70 of the workpiece 60 to complete a linear cut. As discussed above, the cutting wheel 30 is positioned vertically within the slicing apparatus 10 and relative to the workpiece 60 which is fed into contact with the grinding wheel 20 by the table 14 to achieve a linear cut at a selectable depth. More particularly, the cutting wheel 30 is positioned to contact the workpiece 60 generally in the center of the groove 21 made by the grinding wheel 20, as shown in FIGS. 2–4, and is compressively forced through layers 66, 68, and 70 by the cutting wheel carriage 40. The cutting wheel carriage 40 includes support arm 42 attached to housing 16, connector 44, compression spring 47, spring housing 46, and rod 48. The spring housing 46 contains the compression spring 47 or other suitable resilient device with a predetermined length of travel for resiliently applying a force on interconnected wheel spindle 34 that is large enough to push the cutting wheel 30 through the workpiece 60 material, with the specific amount of force selected depending on the materials of the workpiece 60 and the cutting surface of the cutting wheel 30. Although the illustrated cutting wheel carriage 40 applies a vertical compressive force, numerous other mechanisms and configurations will be apparent to persons skilled in the art to apply the force downwardly with a spring or other resilient device (not shown) that attaches to the wheel spindle 34 to pull or to push the wheel spindle 34 downward vertically or angularly. Such downward force could also be provided hydraulically, magnetically, or in many other ways, or it could be applied by simply fixing the cutting wheel 30 in a rigid, immovable vertical position in relation to the table 14.

The cutting wheel 30 is preferably much thinner than the grinding wheel 20 (i.e., cutting wheel 30 width, $w_C$, is much less than grinding face 28 width, $w_F$) and includes a knife-like circumferential edge 32, shown in FIG. 4 as triangular, but other shapes, such as concave or convex tapers, may also be used. The relatively small width, $w_C$, of the cutting wheel 30 facilitates slicing through the rubbery material of layers 66, 68, and 70, and further, in this regard, the cutting wheel 30 and edge 32 may be metallic with a smooth surface finish to reduce friction and may also be coated with a non-frictional material selected to suit the particular materials of the workpiece 60. Referring to FIG. 2, the cutting wheel 30 is mounted onto wheel spindle 34 with spindle fastener 35. To reduce frictional forces and heat build-up during cutting operations, the cutting wheel 30 is free to rotate passively on the wheel spindle 34 as the edge 32 contacts the workpiece 60. Alternatively, the cutting wheel 30 could be driven at some rotational speed, preferably, but not necessarily matching the linear velocity of the cutting edge 32 to the feed rate of the workpiece 60.

A preferred method of sectioning a multi-layer sheet of material such as workpiece 60 with the slicing apparatus 10 begins with precise positioning of the workpiece 60 on the table 14 and fixing the workpiece 60 in place with the clamps 18. A contact or grinding speed is selected for the grinding face 28, and the grinding wheel 20 is driven by a rotating device (not shown) housed in the housing 16 and attached to the drive shaft 24. Based on the desired depth, $d_1$, of cut and the thickness, $t_w$, of workpiece 60, either the grinding wheel 30 is vertically positioned on the housing 16 or the Z-axis position of the table 14 on the bed 12 is selected. A feed rate, feed path, and feed direction are then selected for moving the table 14 to make first contact of the workpiece 60 with the grinding wheel 20. With these settings selected, the table 14 is moved by a translation or feed mechanism (not shown) in the bed 12 to feed the workpiece 60 along a feed path in a feed direction at a selected rate, for example, 1 centimeter per second up to 25 centimeters per second or higher. The grinding wheel 20 may be rotated in either direction, but in a preferred method of sectioning, the grinding wheel 20 is rotated so as to cause the grinding face 28 to move in a direction 15 along the feed direction of the workpiece 60. The suction duct 50 is positioned to remove grinding debris 52 at a location adjacent the cutting wheel 30 to improve the cleanliness and, therefore, the quality of the slit made in the workpiece 60.

Referring to FIG. 3, the grinding wheel 20 first contacts the workpiece 60 and grinds away material from upper layers, illustrated as layers 62, 64, and part of layer 66, at a first cut width, $w_F$, or grinding face width which is preferably at least as great as the thickness, $t_w$, of the workpiece 60. Much of the grinding force is applied in a direction parallel to the feed direction 15 to minimize compressing and deforming the upper layers 62, 64. Although other depths may be selected for this first cut 23, the depth, $d_1$, is preferably at least through the upper two layers 62, 64 (i.e., $t_T+t_C$) and more preferably about half way through the separator layer 64 (i.e., $t_T+t_C+0.5t_S$). The cutting wheel 30 next contacts the workpiece 60 with its cutting edge 32 at about the center of the groove 21 made by the grinding wheel 20. The cutting wheel carriage 40 supplies a resilient compressive force with the spring housing 46 to push the edge 32 of the cutting wheel 30 through the lower and uncut layers 66, 68, 70 of the workpiece 60 to complete the cut. Grinding first with the grinding wheel 20 through the upper layers 62, 64, 66 at a relatively large width (i.e., $w_F \gg w_C$), and next, compressive cutting only lower layers 66, 68, 70 with the knife-like edge 32 enables the slicing apparatus 10 to section a multi-layer sheet 60 of compressible or soft, deformable materials for use in electronic devices without pinching together and short circuiting electrically conductive layers.

While the preferred tandem arrangement is for the wider grinding wheel 20 to lead the narrower cutting wheel 30, as described above, this invention may include reversing that tandem order. In other words, the cutting wheel 30 could lead and make the first cut to a depth, $d_2$, all the way through the thickness, $t_w$, of the workpiece 60, which would look like the prior art cut of FIG. 5. However, the wider grinding wheel 20 could then follow the cutting wheel 30 with the wider grinding wheel 20 removing the upper layers 62, 64, including their deformed cut edges caused by the cutting wheel 30, to a width equal to the wider width of the grinding wheel 20. With such deformed edges of the upper layers 62, 64 removed, the likelihood of electric short circuits between upper layers 62, 64 and lower layers 68, 70 are minimized if not eliminated. This reverse tandem order or sequence of cutting wheel 30 and grinding wheel 20 may work better with vacuum hold-down equipment (not shown) than with clamps 18, because the segregated portions of the workpiece 60 after being sliced first all the way through by the cutter wheel 30 should be retained securely on the table 14 in a manner that prevents lateral movement of the several segments away from each other while the upper layers are being ground by the wider grinding wheel 20.

An alternative embodiment of a grinding wheel 80 for use with the slicing apparatus 10 is illustrated in FIG. 6. The grinding wheel 80 is a symetrically-stepped, multi-stage sectioning device that may be used to grind through a workpiece 60 having a few layers of compressible material or, as shown in FIG. 6, a many-layered sheet, such as workpiece 90, that has eleven or more layers. Further, because the grinding wheel 80 is multi-stage, it is operable to grind through the workpiece 90 without the use of a second cutting tool. Therefore, the cutting wheel 30 does not have to be included in slicing apparatus 10 that includes a multi-stage grinding wheel 80, although a multi-stage grinding wheel 80 can be used together with a cutting wheel 30. For example, a multi-stage grinding wheel could be used to cut through most, but not all, of the layers of material in a workpiece 90, followed by a cutting wheel 30 to cut through the remaining layers. However, to illustrate and describe the multi-stage grinding wheel 80 below, the cutting wheel 30 option described above is not included, because it would be redundant with the description above of the cutting wheel 30 structure and operation.

The grinding wheel 80 preferably includes a hub portion 82, allowing mounting on the drive shaft 24, and an abrasive portion 84 bound to the hub portion 82 although the entire grinding wheel 80 can be made of abrasive material if desired. The abrasive portion 84 comprises abrasive particles with a grain size and a hardness suitable for the materials to be as described above for grinding wheel 30. The abrasive portion 84 preferably includes a number of stages that each have a depth sufficient to cut through a predetermined number of layers of the workpiece 90. For example, in a preferred embodiment, each stage of the abrasive portion 84 is configured to cut through at least three layers of material. Additionally, each successive or later stage of the abrasive portion preferably has a wider grinding surface or face so that more material is removed from upper layers of the workpiece 90 as the stages of the abrasive portion 84 advance through the layers of the workpiece 90. As discussed previously, a wider cut groove in upper layers is desirable in the sectioning of a multi-layer sheet of compressible or deformable material to reduce the possibility that compressive forces applied during cutting of lower layers will pull, pinch, or deform the upper layers into contact or close proximity with the lower layers. To further minimize compressive forces, the grinding wheel 80 may be positioned within slicing apparatus 10 to apply grinding force vector components to the workpiece 90 in a direction substantially parallel to the feed direction and to rotate at high speeds. These and other features, discussed below with reference to the specific embodiment illustrated in FIG. 6, enable the grinding wheel 80 to be used to section a multi-layered sheet of soft, compressible materials without short circuiting electrically conductive layers.

Referring again to FIG. 6, a three-stage grinding wheel 80 is shown grinding through a workpiece 90 having eleven layers of soft, compressible materials for producing an electronic device including cathode layers 91, 93, 99, and 101, conductor layers 92, 96, and 100, separator layers 94 and 98, and anode layers 95 and 97. As will be understood by persons skilled in the art, the present invention is useful for sectioning a wide number of sheet material configurations and is not limited to the specific arrangement shown for workpiece 90. The abrasive portion 84 of the grinding wheel 80 includes first, second, and third stage grinding faces 86, 88, and 89, respectively. The grinding wheel 80 is rotated at high enough angular velocities to produce high linear speeds at the grinding surfaces 86, 88, 89 (e.g., 100 centimeters per minute to 500,000 centimeters per minute and in one preferred embodiment, 20,000 centimeters per minute to 70,000 centimeters per minute).

During sectioning operations, each grinding face 86, 88, 89 contacts, and grinds material from, the workpiece 90 as the workpiece 90 is fed by the table 14 in a selected feed direction 15. Initially, the first stage grinding face 86 contacts the top cathode layer 91 and grinds a groove with a width slightly larger than width, $w_1$, of the grinding face 86. Although the grinding face 86 may have a wide range of widths, a width, $w_1$, equal to or less than the cutting depth, $d_1$, as illustrated in FIG. 6, is preferable. For a polymer lithium-ion bi-cell battery sheet, the width, $w_1$, would be in the range of 0.5 to 1.5 millimeters. The first stage grinding face 86 continues to grind through succeeding layers of the workpiece 90 forming a groove with width, $w_1$, completely through the workpiece 90 along the feed path of the table 14.

When the first stage grinding face 86 has cut to first depth, $d_1$, in the workpiece 90, as shown in FIG. 6, the second stage grinding face 88 contacts the top cathode layer 91 and begins to grind through the workpiece 90 while the first stage grinding face 86 concurrently continues to grind through lower layers. Referring to FIG. 6, the second stage grinding face 88 extends laterally from both sides 186, 187 of the first stage a distance or width, $w_2$, such that the second stage grinding face 88 increases the width of the groove cut by the first grinding face 86 by about two times this width, $w_2$ (i.e., $w_1+2w_2$). The width, $w_2$, may be selected from a large range, with larger widths being desirable for minimizing the risk of deforming upper layers into lower layers, as discussed in detail for the grinding wheel 20, and smaller widths being favored because of the reduced removal of material which helps control material costs and improves energy generation potentials in upper layers of a sectioned battery sheet. In this regard, a width, $w_2$, equal to about cutting depth, $d_2$, may be preferable as a compromise between these manufacturing goals. It should also be understood that, while the second stage grinding face 88 is illustrated as extending perpendicularly from the sides 186, 187 of the first stage, alternative configurations may have later stages with grinding faces extending at an angle greater than ninety degrees from the sides of previous stages. Similarly, while the abrasive portion 84 is illustrated with sharp-cornered steps or stage transitions, these corners may be rounded to facilitate manufacture of the grinding wheel 80 and may also take on this rounded shape during use as sharp corners of the abrasive portion 84 begin to wear and become dull. The second stage grinding face 88 continues to grind through succeeding layers of the workpiece 90 forming a groove with width, $w_1+2w_2$, until the first stage grinding face 86 cuts through the workpiece 90.

Similarly, when the second stage grinding face 88 has cut to second depth, $d_2$, in the workpiece 90, the third stage grinding face 89 contacts the top cathode layer 91 and begins to grind through the workpiece 90, while the first stage and the second stage grinding faces 86, 88, respectively, continue to grind lower layers of the workpiece 90. The third stage grinding face 89 extends out from both sides 188, 189 of the second stage a distance or width, $w_3$, such that the third stage grinding face 88 increases the width of the groove cut by the second stage grinding face 88 by about two times this width, $w_3$ (i.e., $w_1+2w_2+2w_3$). As with the width, $w_2$, the width, $w_3$, may be selected from a large range, with larger widths being desirable for minimizing the risk of deforming upper layers into lower layers, and smaller widths being favored to minimize material removal. In this regard, a width, $w_3$, equal to about cutting depth, $d_3$, may be preferable. The third stage grinding face 89 continues to grind through succeeding layers of the workpiece 90 forming a groove with width, $w_1+2w_2+2w_3$, until the second stage grinding face 86 cuts through the workpiece 90.

In the above manner, the multi-stage grinding wheel 80 advantageously utilizes multiple grinding faces to cut concurrently, or at least partially concurrently, through a many-layered sheet 90. If a sheet with more layers is to be cut, a grinding wheel with more than three stages or with wider and/or deeper stages may be utilized, or, as mentioned above, the lower layers can be cut with a cutting wheel 30. Further, the abrasive portion 84 comprises abrasive particles, such as diamond particles, not only on the grinding faces 86, 88, 89 but also on side areas 186, 187, 188, 189, 190, 191. These side areas 186, 187, 188, 189, 190, 191 of the abrasive portion 84 may contact the layers of the workpiece 90 if any compressive forces are applied during grinding, thereby pinching or pulling upper layers inward toward the grinding wheel 80 and then downward into the slit being formed. During this contact, the side areas initially provide lateral support that minimizes downward movement of the upper layers and then begin to grind and trim the contacting upper layer material, rather than frictionally pulling these upper layers into contact with the lower layers, as occurs with prior art devices (see FIG. 5).

A further preferred embodiment of a grinding wheel 110 for use with the slitting assembly 10 is illustrated in FIG. 7. As illustrated, the grinding wheel 110, rather than having the multiple vertical stepped sides 186, 187, 188, 189, 190, 191 and horizontal grinding faces 86, 88, 89 of the multi-stage grinding wheel 80 described above, has tapered grinding surfaces 116, 118, which can be used to gradually grind through multilayered sheets of compressible material, such as workpieces 60 and 90, by applying grinding forces in a direction substantially parallel to layers within the workpiece. Further, the grinding wheel 110 is operable to grind through a multilayered sheet, such as workpiece 90, without the use of a second cutting tool, and therefore, the cutting wheel 30 does not have to be included in a slicing apparatus 10 that includes a tapered grinding wheel 110. The grinding wheel 110 includes a hub portion 112 to allow mounting on the drive shaft 24 and an abrasive portion 114 bound to the hub portion 112. The abrasive portion 114 comprises abrasive particles, such as diamond particles, with grain size and hardness suitable for the materials to be cut.

A significant feature of the tapered grinding wheel 110 is the inclusion of two, angled grinding faces 116, 118 for contacting and grinding through the workpiece 90. The angled grinding faces 116, 118 form a contact angle, $\theta$, with the layers of the workpiece 90. The contact angle, $\theta$, is selected such that during sectioning operations, the spinning, grinding faces 116, 118 concurrently remove material from successive layers of the workpiece 90 while an acceptable distance is maintained by the abrasive portion 114 between upper and lower layers to control potential short circuiting across electrically conductive layers. Additionally, the contact angle, $\theta$, of the grinding faces 116, 118 results in a triangular cross-sectional area for the abrasive portion 114 that insures more material is removed from upper layers of the workpiece 90 than from lower layers as the abrasive portion 114 advances through the layers of the workpiece 90. As discussed earlier, a wider cut in upper layers is desirable in the sectioning of a multi-layer sheet of compressible or deformable material to reduce the possibility that compressive forces applied during cutting of lower layers will pull or pinch the upper layers into contact or proximity with the lower layers. To further minimize the application of compressive forces, the grinding wheel 110 is positionable during sectioning operations within slicing apparatus 10 so that grinding force vector components are applied to the workpiece 90 in a direction substantially parallel to the feed direction.

A relatively wide range of contact angles, $\theta$, less than 90 degrees may be used to successfully practice the present invention. However, when the manufacturing goals of minimizing material removal to control material costs and of minimizing the risk of shorting are considered, a contact angle, $\theta$, of about 45° or less is preferred for controlling short circuits without undue material removal from upper layers of the workpiece 90. As with the multi-stage grinding wheel 80, the angled grinding faces 116, 118 effectively provide lateral support to upper layers of the workpiece 90 as lower layers are being ground by the sloped grinding wheel 110, thereby reducing the possibility of upper layers being pulled down to contact the lower layers.

Of course, persons skilled in the art may recognize, after becoming familiar with this invention, that the tapered grinding surfaces 116, 118 are equivalent to an infinite number of infinitesimally small multiple stages of stepped vertical and horizontal grinding surfaces of the type described for grinding wheel 80 in FIG. 6. Therefore, such persons skilled in the art may also recognize that this invention includes all possible shapes and numbers of grinding surfaces and/or stages between the configuration of grinding wheel 80 and grinding wheel 110.

The advantageous features of the slicing apparatus 10 and the method for using the same for slicing a multi-layered workpiece 90 may be provided in numerous configurations. For example, a slicing apparatus may be provided that includes more than one grinding wheel, such as several grinding wheels 20 in tandem with trailing grinding wheels having larger widths and set to cut deeper depths than leading grinding wheels and working in combination to slice a sheet of material having many layers. The grinding wheels may also have one of or a combination of rectangular, tapered, and stepped (i.e., multi-stage) cross-sections to achieve a desired cut shape and cutting depth by each included grinding wheel. Further, it may be preferable to configure a slicing apparatus that cuts concurrently from opposing sides of a sheet toward the center of the sheet. In this manner, each grinding wheel may only cut to a certain depth, such as half of the sheet thickness, thereby limiting the number of layers each grinding wheel must cut without compressing or deforming the cut layers into contact with each other.

Figure 8:
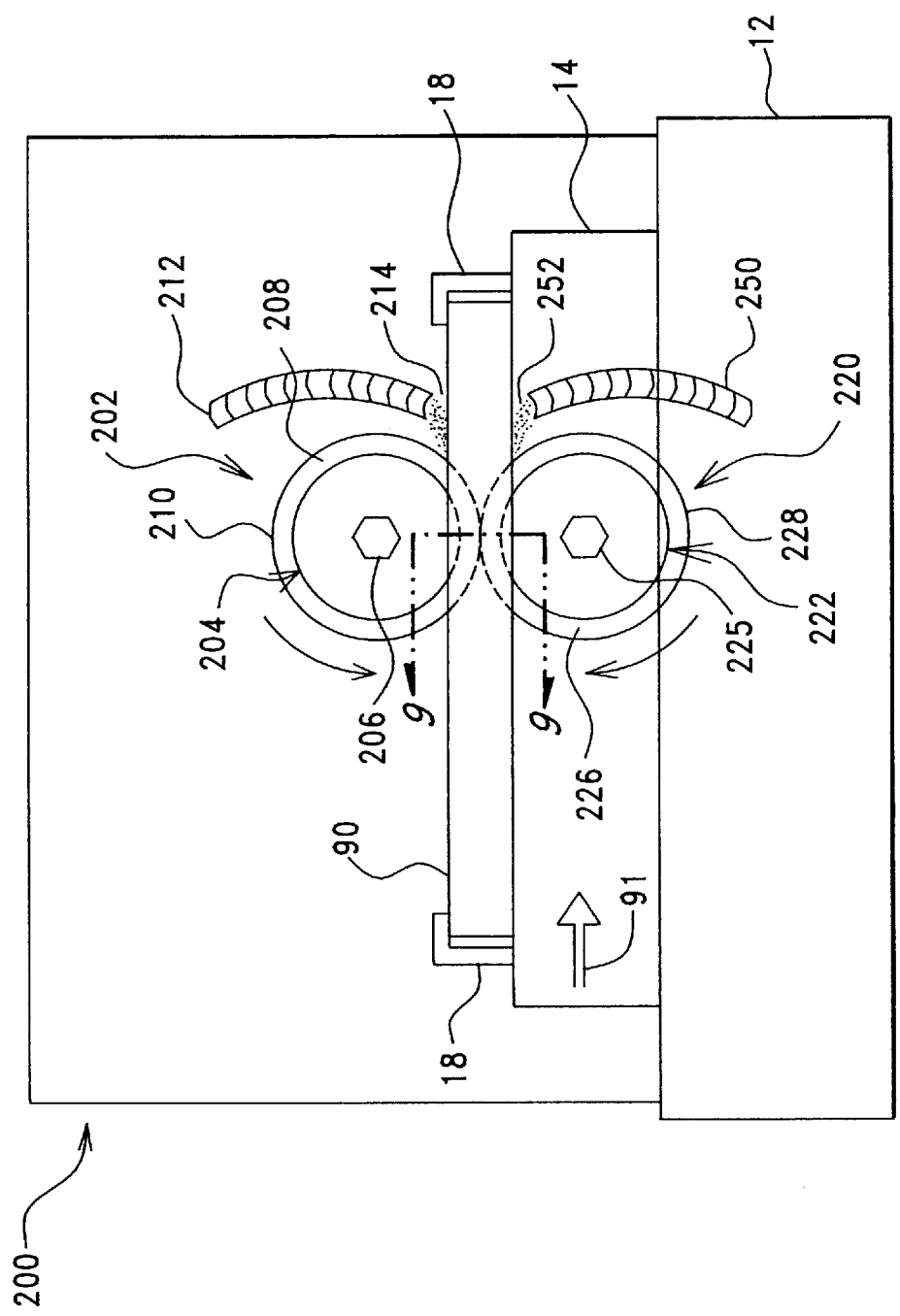
FIG. 8 is a front elevation view similar to FIG. 1 illustrating alternate slicing apparatus having two opposed grinding wheels operable concurrently to slit a multi-layered workpiece.
Figure 9:
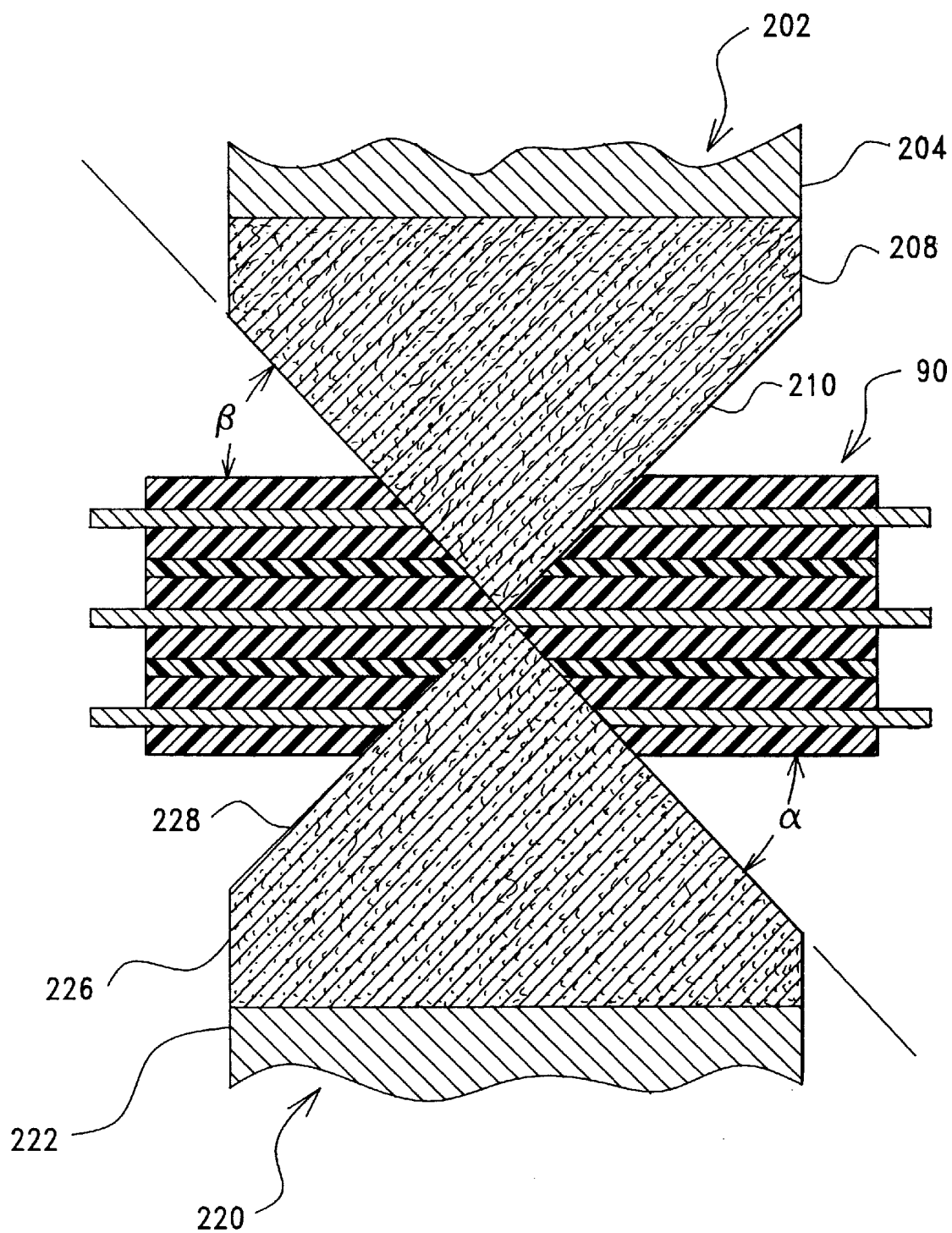
FIG. 9 is a partial cross-sectional view of the opposed cutting wheels of the slicing apparatus of FIG. 8 taken along section line 9—9 in FIG. 8 shown slicing a multi-layered workpiece.

Referring to FIGS. 8 and 9, alternate slicing apparatus 200 is illustrated having two grinding wheels 202, 220 that concurrently contact an upper side and a lower side of a workpiece 90. In this manner, the cutting forces required to cut or separate the workpiece 90 are substantially equally distributed to each grinding wheel 202, 220, particularly if each grinding wheel 202, 220 cuts through approximately half of the workpiece 90 thickness and if the material in the upper and lower layers of the workpiece 90 have substantially the same hardness and other physical characteristics. Importantly, by dividing the cutting forces between the two wheels 202 and 220, the slicing apparatus 200 can more readily grind through the layers of the workpiece 90 by applying cutting forces substantially parallel to the feed direction and the plane of the workpiece 90. As with the slicing apparatus 10, the slicing apparatus 200 is operable to cut through a multi-layered workpiece 90 without compressing or deforming the layers together.

As illustrated, the slicing apparatus 200 generally operates similarly to the slicing apparatus 10, therefore, a full discussion of its operation will not be repeated here. The slicing apparatus 200 includes a first, upper grinding wheel 202, a hub portion 204, a spindle fastener 206, an abrasive portion 208 with a grinding face 210, and a first suction duct 212 for removing grinding dust 214. During slicing operations, the work piece 90 is moving along the direction indicated by arrow 91 as the upper grinding wheel 202 rotates and is positioned to contact the workpiece 90 with the grinding face 210 of the abrasive portion 208, so as to cut to a first depth, for example, one half the thickness of the workpiece 90. By limiting the depth of the cut and by selecting a large diameter (relative to the workpiece 90 thickness) grinding wheel 202, the cutting force vector components are maintained substantially parallel to the feed direction and to the workpiece 90.

To cut through the lower layers of workpiece 90, the slicing apparatus 200 includes a second, lower grinding wheel 220, a hub portion 222, a spindle fastener 225, an abrasive portion 226 with a grinding face 228, and a second suction duct 250 for removing grinding dust 252. During slicing operations, the second grinding wheel 220 is rotated and positioned relative to the workpiece 90 to contact it on an opposite side as compared to the first grinding wheel 202. This contact and resulting grinding occurs concurrently with the contact and grinding by the first grinding wheel 202. To achieve a cut completely through the workpiece 90, the second grinding wheel 220 is positioned to cut to a second depth so that the grinding face 228 of the abrasive portion 226 grinds through the portions of the workpiece 90 not cut by the first grinding wheel 202. For example, each wheel 202, 220 may be positioned such that each cuts through substantially one half of the thickness of the workpiece 90, and the two wheels 202, 220 nearly contact each other, i.e., a minimal clearance is provided to complete the cit but to also control wear of the grinding faces 210, 228.

As will be understood, any of the grinding wheel configurations (see FIGS. 3, 6, and 7) discussed previously may be chosen for the grinding wheels 202, 220. In one preferred embodiment illustrated in FIG. 9, each of the grinding wheels 202, 220 is a tapered grinding wheel having triangular-shaped abrasive portions 208, 226. In this embodiment, the grinding face 220 forms a cutting angle, $\beta$, with the one side of the workpiece 90, and the grinding face 228 forms a cutting angle, $\alpha$, with the opposite side of the workpiece 90. Generally, the cutting angles, $\beta$, $\alpha$, may be any angle less than 90 degrees, and, preferably may be about 45 degrees or less. Further, the cutting angles, $\beta$, $\alpha$, may be substantially equal to provide symmetric cut cross sections and resulting sectioned pieces or the cutting angles, $\beta$, $\alpha$, may differ from one another to achieve myriad cut shapes or cross sections.

The foregoing description is considered as illustrative of only the principles of the invention, and while the description and exemplary application of this invention has been directed primarily to the sectioning of multi-layer sheets having five layers and eleven layers of material for fabricating uni-cell and bi-cell polymer lithium-ion batteries, respectively, it is not restricted to that application. Other applications include, for example, sectioning of sheet material with any number of layers of soft, compressible or deformable materials for use in electronic devices. Additionally, because the invention is particularly apt for cutting multi-layer sheets with little or no compression of the layers, the invention may be used for cutting layered sheets containing non-compatible (i.e., chemically, biochemically, and electrically reactive) materials that are separated by a compressible and/or flexible material, such as a polymer or rubber separator or insulator layer. Since the methods and apparatus for cutting a multi-layered sheet with non-compatible materials is similar to that described for battery material sheets, reference to the above specific example may be made to fully understand this application of the present invention. Furthermore, since numerous modifications and changes will readily occur to those skilled in the art, it is not desired to limit the invention to the exact construction and process shown and described above. For example, the present invention may readily be modified to include one or more cross feed grinding wheels for further sectioning long strips into smaller polygonal pieces. Similarly, it may be useful to modify the linear feed device disclosed for arcuate or other non-linear feed paths. Further, the present invention expressly encompasses the mounting of a grinding wheel on a roller axis with the included roller surfaces providing a calender function to flatten or smooth any raised edges and/or to press down on the workpiece as the grinding wheel applies parallel and upward forces on the workpiece during sectioning. Accordingly, resort may be made to all suitable modifications and equivalents that fall within the scope of the invention as defined by the claims which follow. The words "comprise," "comprises," "comprising," "include," "including," and "includes" when used in this specification and in the following claims are intended to specify the presence of stated features, integers, components, or steps, but they do not preclude the presence or addition of one or more other features, integers, components, steps, or groups thereof.

The embodiments of the invention in which an exclusive property or privilege is claimed are defined as follows:

1. A method for slitting a thin, flexible electronic device having a plurality of electrically conductive layers and at least one insulative separator layer without forming a short circuit between any two of the electrically conductive layers, the method comprising the steps of:

positioning the device on a support means for rigidly supporting the electronic device;

providing a slitting wheel having at least one annular contact surface comprising abrasive particles;

rotating the slitting wheel in a predetermined direction to move the at least one contact surface at a predetermined velocity;

first contacting a top layer of the device with an initial contact surface of the slitting wheel to grind through the top layer, the initial contact surface having a contact width to form a slit having substantially the contact width in the top layer, wherein contact forces between the first contact surface and the top layer are substantially parallel to an axis in the top layer;

sequentially grinding, with the initial contact surface, through each layer, including a bottom layer, of the device below the top layer of the device forming slits having substantially the contact width of the initial contact surface; and second contacting and grinding the top layer and, sequentially, a predetermined number of the layers of the device below the top layer, with at least one additional contact surface of the slitting wheel, the at least one additional contact surface having a contact width larger than the contact width of the initial contact surface, whereby progressively more material is removed from upper layers than from lower layers of the device;

wherein the sequentially grinding step and the second contacting step are performed at least partially contemporaneously.

2. The method of claim 1, wherein the electrically conductive layers include anode and cathode layers bounded by a polymer and the separator layer comprises said polymer.

3. The method of claim 1, wherein the abrasive particles are fabricated from materials selected from the group consisting of diamond, aluminum oxide, silicon carbide, and cubic boron nitride.

4. The method of claim 1, wherein the predetermined velocity is greater than about 20,000 inches per minute.

5. The method of claim 1, further including the steps of:
positioning the slitting wheel in a feed path of the positioned device; and
moving the device with a feeding assembly in a feed direction along the feed path to contact the slitting wheel, the moving step continuing after the contact with the slitting wheel at least until the contact has ended.

6. The method of claim 1, further including the step of moving the slitting wheel relative to the device concurrently with the first contacting step, the sequentially grinding step, and the second contacting and grinding step to form a slit along an entire length of the device to separate the device into two pieces.

7. The method of claim 1, further including the step of positioning a dust removal device adjacent to the slitting wheel to remove grinding debris, the dust removal device including a suction means for suctioning the grinding debris.

8. The method of claim 1, wherein the slitting wheel comprises a symmetrically-stepped grinding wheel, wherein the initial contact surface forms the peripheral surface of a central stage of the grinding wheel having a first diameter and wherein each additional contact surface forms the peripheral surface of a different stage of the grinding wheel having a diameter less than the first diameter.

9. The method of claim 8, wherein the grinding wheel includes a second contact surface forming the peripheral surface of a second stage with a diameter less than the first diameter and includes a third contact surface forming the peripheral surface of a third stage with a diameter less than the second diameter.

10. The method of claim 1, wherein the slitting wheel includes a contact portion containing each of the contact surfaces, the contact portion having a triangular cross-sectional configuration.

11. The method of claim 10, wherein the two sides of the triangular cross-section of the contact portion form angles with the top layer of less than about 90 degrees.

12. The method of claim 11, wherein the formed angles are about 45 degrees.

13. Slicing apparatus for cutting individual slices out of sheets fabricated with multiple layers of materials comprising:
a grinding wheel with a first width set to cut a groove into the sheet to a first depth that extends through fewer than all of said layers; and
a cutting wheel positioned in tandem relation with the grinding wheel, but set to cut from said groove to a second depth that extends through all of said layers, said cutting wheel having a second width that is less than said first width.

14. The slicing apparatus of claim 13, including a translatable table positioned under said grinding wheel and said cutting wheel, said sheet being mountable on said table.

15. The slicing apparatus of claim 14, wherein said table is moveable in tangential relation to said grinding wheel and said cutting wheel.

16. The slicing apparatus of claim 15, wherein said table is moveable tangentially in relation to said grinding wheel and to said cutting wheel in a direction such that said grinding wheel leads said cutting wheel in cutting into said sheet.

17. The slicing apparatus of claim 15, wherein said table is moveable tangentially to said grinding wheel and to said cutting wheel in a direction such that said grinding wheel trails said cutting wheel in cutting into said sheet.

18. The slicing apparatus of claim 15, wherein said cutting wheel is passively rotatable.

19. The slicing apparatus of claim 13, wherein said grinding wheel is driven in a rotational manner.

20. Slicing apparatus for cutting slices out of a sheet fabricated with multiple layers of materials, comprising:
a multi-stage grinding wheel with (i) a first stage annular grinding surface that has a first width and a first stage diameter and (ii) a second stage annular grinding surface that has a second stage diameter larger than said first stage diameter and is positioned concentrically with, and radially outward from said first stage annular grinding surface, said second stage annular grinding surface having a second stage width that is less than said first stage width; and
a table adapted to support and retain the sheet adjacent the multi-stage grinding wheel in a position such that the first stage annular grinding surface is set to cut through all of said layers while the second stage annular grinding surface is set to cut through fewer than all of said layers.

21. The slicing apparatus of claim 20, wherein said grinding wheel is moveable parallel to said table.

22. The slicing apparatus of claim 20, wherein said table is moveable tangential to said grinding wheel.

23. The slicing apparatus of claim 20, wherein said grinding wheel is driven to rotate about an axis in a manner that moves said first stage annual grinding surface and said second stage annular driving surface in relation to said sheet.

24. Slicing apparatus for cutting slices out of a sheet fabricated with multiple layers of materials, comprising:
a tapered grinding wheel with a circular periphery spaced radially outward from an axis of rotation, said grinding wheel having an annular tapered grinding surface that extends radially inwardly and laterally outwardly from the circular periphery a sufficient distance such that said annular tapered grinding surface has a radial dimension component large enough to extend through all of the layers of the material;

a table adapted to support and retain the sheet adjacent the tapered grinding wheel in a position such that the annular tapered grinding surface is set to cut through all of said layers in a manner that each layer is cut a different mean width than adjacent layers.

25. The slicing apparatus of claim 24, wherein said grinding wheel is moveable parallel to said table.

26. The slicing apparatus of claim 24, wherein said table is moveable tangential to said circular periphery of the grinding wheel.

27. The slicing apparatus of claim 24, wherein said annular tapered grinding surface is a first annular tapered grinding surface and said tapered grinding wheel also has a second annular tapered grinding surface that extends radially inwardly and laterally outwardly in an opposite lateral direction from said first annular tapered grinding surface.

28. Slicing apparatus for cutting slices out of a sheet fabricated with multiple layers of materials, each of which has a layer thickness and all of such layer thicknesses together comprising a total sheet thickness that extends from a first side of said sheet to a second side of said sheet, said slicing apparatus comprising:

a first tapered grinding wheel with a first circular periphery spaced radially outward from a first axis of rotation and adapted to be positioned adjacent the first side of said sheet, said first tapered grinding wheel having an annular tapered grinding surface that extends radially inwardly and laterally outwardly from the circular periphery of said first tapered grinding wheel a sufficient distance such that said annular tapered grinding surface of said first tapered grinding wheel has a radial dimension component large enough to extend at least half-way through the total sheet thickness; and a second tapered grinding wheel with a second circular periphery spaced radially outward from a second axis of rotation adapted to be positioned adjacent the second side of said sheet, said second tapered grinding wheel having an annular tapered grinding surface that extends radially inwardly and laterally outwardly from the circular periphery of said second tapered grinding wheel a sufficient distance such that said annular tapered grinding surface of said second tapered grinding wheel has a radial dimension component large enough to extend at least half-way through the total sheet thickness.

29. The slicing apparatus of claim 28, wherein:

said annular tapered grinding surface of said first tapered grinding wheel is a first annular tapered grinding surface, and said first tapered grinding wheel also has a second annular tapered grinding surface that extends radially inwardly and laterally outwardly in an opposite lateral direction from said first annular tapered grinding surface; and said annular tapered grinding surface of said second tapered grinding wheel is a third annular tapered grinding surface, and said second tapered grinding wheel also has a fourth annular tapered grinding surface that extends radially inwardly and laterally outwardly in an opposite lateral direction from said third annular tapered grinding surface.

30. The slicing apparatus of claim 28, wherein said first circular periphery and said second circular periphery are positioned in a common plane that extends diametrically through said first circular periphery as well as diametrically through said second circular periphery.

31. The slicing apparatus of claim 28, wherein said first circular periphery and said second circular periphery are laterally offset from each other.

32. Slicing apparatus for cutting slices out of a sheet fabricated with multiple layers of materials, each of which has a layer thickness and all of such layer thicknesses together comprising a total sheet thickness that extends from a first side of said sheet to a second side of said sheet, said slicing apparatus comprising:

a first multi-stage grinding wheel adapted to be positioned adjacent the first side of the sheet and set to cut with a narrower width of the first multi-stage grinding wheel at least half way through the total sheet thickness and to cut with a wider width of the first multi-stage grinding wheel less than half way through the total sheet thickness; and a second multi-stage grinding wheel adapted to be positioned adjacent the second side of the sheet and set to cut with a narrower width of the second multi-stage grinding wheel at least half way through the total sheet thickness and to cut with a wider width of the second multi-stage grinding wheel less than halfway through the total sheet thickness.

33. A method of slicing a sheet of laminated materials having at least two layers of deformable electrically conductive materials separated by at least one separator layer in a manner that avoids deforming the electrically conductive layers into electrical contact with each other, comprising:

grinding a first groove having a first width into said sheet to a depth that extends through at least one of the electrically conductive layers but not through the separator layer; and cutting from the first groove through both the separator layer and other electrically conductive layer with a cut that has a second width which is narrower than said first width.

34. The method of claim 33, including grinding said first groove into, but not through, the separator layer.

35. The method of claim 33, including grinding said first groove with a grinding wheel.

36. The method of claim 33, including cutting through the separator layer and the other electrically conductive layer with a cutting wheel that has a peripheral cutting edge.

37. The method of claim 33, wherein the sheet of laminating materials has a thickness and said first groove has a width that is at least as large as said thickness.

38. The method of claim 33, including cutting through the separator layer and the other electrically conductive layer with a grinding wheel that has a peripheral grinding surface.

39. A method of slicing a sheet of laminated materials having at least two layers of deformable electrically conductive materials separated by at least one separator layer in a manner that avoids deforming the electrically conductive layers into electrical contact with each other comprising:

grinding through all the layers of the sheet with a first cut having a first width; and grinding into said sheet with a groove having a second width that extends laterally from said first cut to a depth that extends through at least one of the electrically conductive layers but not through the separator layer.

40. The method of claim 39, including grinding said groove into, but not through, the separator layer.

41. The method of claim 39, including grinding through all the layers of the sheet with a grin wheel that has a peripheral grinding surface.

42. The method of claim 39, including grinding into said sheet with said groove having a second width by using a grinding wheel with a peripheral grinding surface.

43. The method of claim 42, including grinding said groove into, but not through, the separator layer.

44. The method of claim 43, including cutting through all the layers of the sheet with said first cut by using a cutting wheel with a peripheral cutting edge.

45. The method of claim 43, including cutting through all the layers of the sheet with said first cut by using a grinding wheel with a peripheral grinding surface that has a grinding surface width equal to said first width.

46. The method of claim 43, including grinding into said sheet to create said groove having said second width with a grinding wheel that has a peripheral grinding surface with a grinding surface width equal to said second width.

47. The method of claim 43, wherein said sheet has a thickness and said second width is at least as great as said thickness.

48. A method of slicing a sheet of laminated materials having at least two layers of deformable, electrically conductive materials separated by at least one separator layer, comprising:

cutting through all the layers of the sheet with a first cut having a first width; and grinding into said sheet with a grinding surface to create a groove having a second width, which is greater than said first width, and which extends through at least one of the electrically conductive layers but not through another of the electrically conductive layers that is separated from said one, of the electrically conductive layers by the separator layer.

* * * * *